United States Patent
Tsuchiya et al.

(10) Patent No.: US 8,669,562 B2
(45) Date of Patent: Mar. 11, 2014

(54) SEMICONDUCTOR DEVICE AND METHOD FOR MANUFACTURING THE SAME

(75) Inventors: Yoshinori Tsuchiya, Kanagawa (JP); Takashi Shinohe, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 132 days.

(21) Appl. No.: 13/404,728

(22) Filed: Feb. 24, 2012

(65) Prior Publication Data

US 2013/0062624 A1 Mar. 14, 2013

(30) Foreign Application Priority Data

Sep. 8, 2011 (JP) ................. 2011-195980

(51) Int. Cl.
 *H01L 29/16* (2006.01)
 *H01L 21/265* (2006.01)
 *H01L 21/336* (2006.01)

(52) U.S. Cl.
 USPC ............. 257/77; 257/E29.082; 257/E21.335; 257/E21.409; 438/522; 438/285

(58) Field of Classification Search
 USPC ............. 257/77, E21.335, E21.409, E29.082; 438/285, 522
 See application file for complete search history.

(56) References Cited

U.S. PATENT DOCUMENTS

2007/0138482 A1 6/2007 Tanimoto

FOREIGN PATENT DOCUMENTS

| JP | 3646548 | 2/2005 |
| JP | 2007-184571 | 7/2007 |

*Primary Examiner* — Jarrett Stark
*Assistant Examiner* — Lawrence Tynes, Jr.
(74) *Attorney, Agent, or Firm* — Oblon, Spivak, McClelland, Maier & Neustadt, L.L.P.

(57) ABSTRACT

A semiconductor device according to an embodiment includes a silicon carbide, a metal silicide formed on the silicon carbide and including a first layer and a second layer having a carbon ratio lower than that of the first layer, and a metallic electrode formed on the metal silicide, wherein the second layer is formed on the first layer, and the second layer is in contact with the metallic electrode, and an average grain diameter of a metal silicide in the second layer is larger than an average grain diameter of a metal silicide in the first layer.

4 Claims, 15 Drawing Sheets

SEMICONDUCTOR DEVICE AND METHOD FOR MANUFACTURING THE SAME

CROSS-REFERENCE TO RELATED APPLICATION

This application is based upon and claims the benefit of priority from Japanese Patent Application No. 2011-195980, filed on Sep. 8, 2011, the entire contents of which are incorporated herein by reference.

FIELD

Embodiments described herein relate generally to a semiconductor device and a method for manufacturing the semiconductor device.

BACKGROUND

As a next generation power semiconductor device material, silicon carbide (which may be hereinafter also denoted as SiC) attracts attention. SiC has about 10 times the breakdown field strength and about three times the thermal conductivity of silicon (which may be hereinafter also denoted as Si), and SiC can achieve a power semiconductor device capable of operating at a high temperature with a low loss, which cannot be achieved with a Si power device.

For example, a high-breakdown voltage power MOSFET has a low ON-resistance and high breakdown voltage, and can achieve fast switching operation. Accordingly, it is widely used as a switching device for a power circuit such as a switching power supply. The device structure of the high-breakdown voltage power MOSFET has a vertical-type MOSFET structure in which a source electrode, a gate electrode, and a well electrode are formed on a substrate surface, and a drain electrode is formed on a back surface of the substrate. Double Implantation MOSFET (which may be hereinafter also denoted as DIMOSFET) structure in which a channel formation region (well region) and a source region are respectively formed on a substrate surface using ion implantation is an advantageous device structure in which the channel region can be easily formed with high precision, and this is also suitable for parallel operation.

When a DIMOSFET using a SiC substrate is formed, an electrode for connecting this device to an electrical circuit and the like is desired to be in ohmic contact. However, a generally used hexagonal single-crystal SiC substrate has 4H—SiC structure of which laminating cycle is 4, and an energy band gap thereof is 3.26 eV, i.e., three times the energy band gap of Si. Therefore, it is difficult to form ohmic contact with an electrode metal.

In contrast to the SiC substrate, a method for forming a nickel silicide layer in the electrode portion is known as a method for achieving a relatively low ohmic contact resistance. The nickel silicide layer is formed by depositing nickel on a SiC substrate surface of the contact region and thereafter performing thermal treatment. One of the problems in forming a nickel silicide electrode includes contact property degradation with the metal electrode due to nickel silicide surface precipitation of carbon (C).

DETAILED DESCRIPTION

Figure 1:
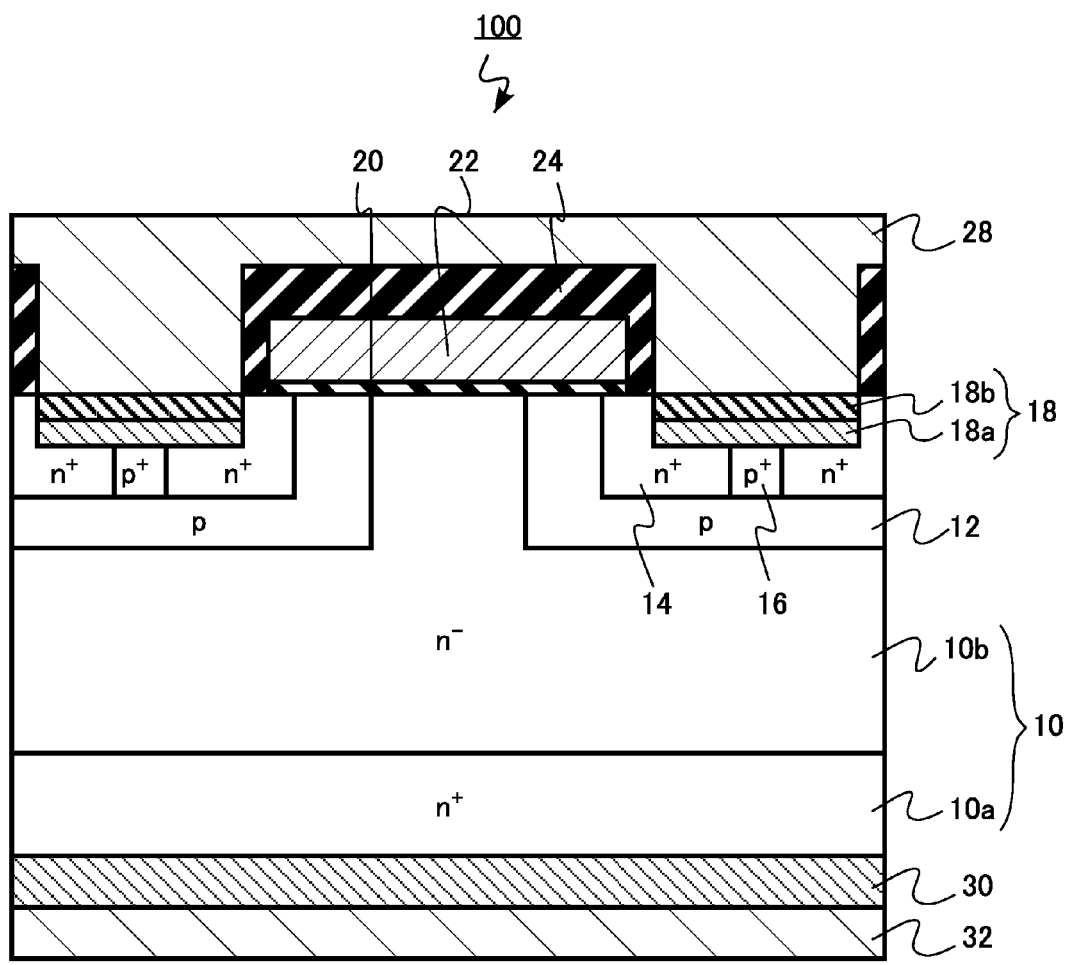
FIG. 1 is a cross sectional schematic diagram illustrating a semiconductor device according to a first embodiment.

A semiconductor device according to an embodiment includes a silicon carbide, a metal silicide formed on the silicon carbide and including a first layer and a second layer having a carbon ratio lower than that of the first layer, and a metallic electrode formed on the metal silicide, wherein the second layer is formed on the first layer, and the second layer is in contact with the metallic electrode, and an average grain diameter of a metal silicide in the second layer is larger than an average grain diameter of a metal silicide in the first layer.

As described above, one of the problems in forming the nickel silicide electrode on the SiC substrate for achieving ohmic contact includes contact property degradation with the metal electrode due to nickel silicide surface precipitation of carbon (C).

When the nickel silicide is formed, the carbon is discharged out of the crystal grain, and a carbon precipitation layer is formed on the surface of the nickel silicide. In the manufacturing process of the semiconductor device, it is difficult to remove this carbon precipitation layer with a generally-used acid chemical liquid. The carbon precipitation layer does not have sufficient contact property with titanium (Ti) and aluminum (Al), i.e., a metallic electrode and a wiring material formed in an upper portion, and sufficient contact characteristics are not obtained. Moreover, during the manufacturing process of the device or during the use of the device, film peel-off and degradation of the contact characteristics may occur.

Solutions to this problem include a method for physically removing the carbon precipitation layer using a method such as sputtering and a method for applying a structure (Ti-cap structure) using a layer serving as a carbon adsorption layer such as titanium (Ti). Although these methods can be applied to a thick nickel silicide film, these methods may reduce the performance of a device if it is applied to a thin nickel silicide film having a thickness of, e.g., 100 nm or less.

More specifically, when the carbon precipitation layer is sputtered and etched, the unevenness of the surface of the nickel silicide film becomes large at the same time, and when it is applied to the thin nickel silicide film, a region without nickel silicide is partially generated, and this may cause degradation of characteristics such as increase of the contact resistance and poor withstand voltage.

Moreover, the effect of the Ti-cap structure is reduced when the film thickness of the nickel silicide is thin, and with the Ti-cap structure, it is difficult to maintain the carbon concentration on the surface of the nickel silicide at a sufficiently low level.

For example, a Schottky barrier diode, i.e., a rectifying device, is required to achieve preferable ohmic contact with low-temperature thermal history. More specifically, in a case of an MPS (Merged PiN and Schottky) structure, a p-type ohmic electrode is formed on a p-type layer to pass a surge current, and an n-type ohmic electrode is formed on an n-type channel stop layer at a junction termination region end portion.

An oxide film is formed on the SiC in the junction termination region. When the interface between the oxide film and the SiC is made rough due to the high-temperature thermal treatment for forming the electrode, the extension of the depletion layer is affected, which may cause problems such as drop of the withstand voltage, increase of the leakage current, and reduction of the reliability. In order to prevent this, it is desired to form an ohmic electrode at a low temperature at which the interface between the oxide film and the SiC is not made rough.

Hereinafter, embodiments of the present invention will be described with reference to the drawings.

(First Embodiment)

A semiconductor device according to the present embodiment includes a silicon carbide, a metal silicide formed on the silicon carbide and including a first layer and a second layer having a carbon ratio lower than that of the first layer, and a metallic electrode formed on the metal silicide. The second layer is formed on the first layer, and the second layer is in contact with a metallic electrode. An average grain diameter of the metal silicide in the second layer is more than an average grain diameter of the metal silicide in the first layer.

The semiconductor device according to the present embodiment has the above configuration, so that the carbons (C) on the surface of the metal silicide are reduced, which improves the contact property with the upper portion metallic electrode. Therefore, the contact characteristics and reliability are improved. For example, as the contact characteristics, improvement of ohmic property and low resistance can be achieved. Even when the film thickness of the metal silicide is thin, the improvement of the contact property with the upper portion metallic electrode of the surface and the metal silicide can be achieved with a simple manufacturing method.

Hereinafter, DIMOSFET will be explained as an example of semiconductor device.

The DIMOSFET according to the present embodiment includes a semiconductor substrate having a first n-type silicon carbide layer and a second n-type silicon carbide layer of which n-type impurity concentration is less than that of the first n-type silicon carbide layer, a first p-type impurity region formed in the second n-type silicon carbide layer, an n-type impurity region formed in the second n-type silicon carbide layer, a second p-type impurity region connected to the first p-type impurity region and having a depth shallower than that of the first p-type impurity region and having a p-type impurity concentration higher than that of the first p-type impurity region, a gate insulating film extending over surfaces of the second n-type silicon carbide layer, the first p-type impurity region, and the n-type impurity region, a gate electrode on the gate insulating film, a metal silicide formed on the n-type impurity region and the second p-type impurity region and including a first layer and a second layer having a carbon ratio less than that of the first layer, and a metallic electrode formed on the metal silicide. The second layer is formed on the first layer, and the second layer is in contact with a metallic electrode. An average grain diameter of the metal silicide in the second layer is more than an average grain diameter of the metal silicide in the first layer.

FIG. 1 is a cross sectional schematic diagram illustrating a semiconductor device according to the present embodiment. The semiconductor device according to the present embodiment is a DIMOSFET.

As shown in FIG. 1, the DIMOSFET 100 includes a SiC substrate 10 of hexagonal 4H—SiC including an $n^+$-type SiC layer (first n-type silicon carbide layer) 10a and an $n^-$-type SiC layer (second n-type silicon carbide layer) 10b having an n-type impurity concentration lower than that of the $n^+$-type SiC layer 10a.

For example, the $n^+$-type SiC layer 10a includes n-type impurity such as N (nitrogen) with an impurity concentration of about $1\times10^{18}$ to $1\times10^{19}$ cm$^{-3}$. The $n^+$-type SiC layer 10a functions as a drain region of the DIMOSFET 100.

For example, the $n^-$-type SiC layer 10b is formed using an epitaxial growth method on the $n^+$-type SiC layer 10a. For example, the impurity concentration of the n-type impurity is about $1\times10^{15}$ to $1\times10^{17}$ cm$^{-3}$. The thickness of the $n^-$-type SiC layer 10b is, for example, about 5 to 10 μm.

In the $n^-$-type SiC layer 10b, a p-type SiC region (first p-type impurity region) 12 is formed. The p-type SiC region 12 functions as a channel region or a well region of the DIMOSFET 100. The impurity concentration of the p-type SiC region 12 is, for example, about $5\times10^{16}$ to $2\times10^{19}$ cm$^{-3}$. The junction depth is about 0.1 μm to 1.5 μm.

In the $n^-$-type silicon carbide layer 10b, an $n^+$-type SiC region (n-type impurity region) 14 is formed to be enclosed by the p-type SiC region 12. The $n^+$-type SiC region 14 functions as a source region of the DIMOSFET 100.

The junction depth thereof is within a range of 0.05 μm to 1 μm, which is shallower than the junction depth of the p-type SiC region 12. The impurity of the $n^+$-type SiC region 14 is, for example, nitrogen (N) or phosphorus (P) or both of them, and for example, the impurity concentration is preferably about $5\times10^{19}$ to $3\times10^{21}$ cm$^{-3}$.

In the $n^-$-type SiC layer 10b, a $p^+$-type SiC region (second p-type impurity region) 16 is formed. The $p^+$-type SiC region (second p-type impurity region) 16 is enclosed by the p-type SiC region 12, is connected to the p-type SiC region 12, and is in contact with the $n^+$-type SiC region 14. The $p^+$-type SiC region 16 functions as a well connection region of the DIMOSFET 100.

The depth of the $p^+$-type SiC region 16 is in a range of 0.05 μm to 1 μm, which is shallower than the p-type SiC region 12.

The impurity in the p+-type SiC region 16 is boron (B) or aluminum (Al), or both of them. The impurity concentration is desirably about $1\times10^{19}$ to $3\times10^{21}$ cm$^{-3}$.

On the n+-type SiC region 14 and the p+-type SiC region 16, a first nickel silicide region (nickel silicide film) 18 is formed. The first nickel silicide region 18 functions as a source electrode and a well electrode of the DIMOSFET 100.

The film thickness of the first nickel silicide region 18 is in a range of, for example, 10 nm to 200 nm, which is thinner than the depths of the n+-type SiC region 14 and the p+-type SiC region 16. From the view point of reducing the sheet resistance of the source electrode, the film thickness of the nickel silicide region 18 is preferably thicker. This is because the specific resistance of the nickel silicide is one tenth or less than that of the n+-type SiC region 14. In view of this point, the thickness (junction depth) of the n+-type SiC region 14 is desirably ensured to be equal to or more than 10 nm, and more preferably it is 50 nm or more.

In view of heat resistance of the nickel silicide film, the first nickel silicide region 18 is preferably equal to or more than 20 nm. When the film thickness is equal to or less than 20 nm, and thermal step of 600° C. or more is added to the silicide thermal step, the nickel silicide film is aggregated, so that the device performance may be degraded caused by the device yield degradation and increase of the sheet resistance value.

On the other hand, when the film thickness of the first nickel silicide region 18 is increased, and the n+-type SiC region 14 becomes thin, the junction leak current increases, which may degrade the device performance. Therefore, the film thickness of the first nickel silicide region 18 is more desirably equal to or less than 100 nm. The n+-type SiC region 14 is required to be made thin in order to suppress the short channel effect when the size of the DIMOSFET 100 is reduced. From this view point, the thickness of the first nickel silicide region 18 is desirably equal to or less than 100 nm.

The first nickel silicide region 18 includes a first layer (high carbon concentration layer) 18a and a second layer (low carbon concentration layer) 18b having a carbon ratio (carbon concentration) lower than that of the first layer 18a. The second layer 18b is formed on the first layer 18a, i.e., the second layer 18b is formed at a side away from the n+-type SiC region 14 and the p+-type SiC region 16 with respect to the first layer 18a. The average grain diameter of the nickel silicide in the second layer 18b is more than the average grain diameter of the nickel silicide in the first layer 18a.

The carbon ratio in the second layer 18b is preferably less than 20 atomic %. When the carbon concentration on the surface of the nickel silicide decreases, this improves the contact property between the first nickel silicide region 18 and a first metallic electrode 28 explained below. Therefore, this suppresses film peel-off of the first metallic electrode 28, and the DIMOSFET 100 is achieved with high performance and high reliability.

The carbon ratio in the first layer 18a is preferably equal to or more than 20 atomic %. More preferably, it is equal to or more than 30 atomic %. This is because the first layer 18a functions as an absorption layer of carbon, and prevents carbons (C) from dispersing from the SiC substrate 10 to the surface of the first nickel silicide region 18.

The carbon ration in the first layer 18a is preferably equal to or less than 80 atomic %, and more preferably, it is equal to or less than 60 atomic %. When the carbon ratio increases too much, the sheet resistance of the first layer 18a increases, which increases the parasitic resistance. Accordingly, the ON-resistance of the DIMOSFET 100 increases, which may become a cause of obstructing fast operation.

When the carbon ratios of the first layer 18a and the second layer 18b are discussed, the value close to the center of each layer in the film thickness direction is employed as a representing value. As a method for evaluating a carbon ratio, Auger electron spectroscopy may be used. On the other hand, as a method for evaluating a carbon ratio in a local region, EELS (Electron Energy-Loss Spectroscopy) analysis using a transmission electron microscope may be used.

A gate insulating film 20 is continuously formed over the surfaces of the second n-type SiC layer 10b, the p-type SiC layer 12, and the n+-type SiC region 14. The gate insulating film 20 does not have to cover the entire surface of the surface of the n+-type SiC region 14.

The gate insulating film 20 may be, for example, a silicon oxide film. The film thickness of the silicon oxide film is desirably between 10 nm and 160 nm, inclusive.

On the gate insulating film 20, a gate electrode 22 is formed. The gate electrode 22 may be, for example, polycrystal silicon and the like.

The impurity concentration of the polycrystal silicon is desirably about $1\times10^{19}$ cm$^{-3}$. Regarding the impurity, n-type or p-type impurity element may be selected according to the threshold voltage required for the device.

On the gate electrode 22, for example, a layer insulating film 24 made of a silicon oxide film is formed.

On the layer insulating film 24, a first metallic electrode 28 is formed. In a contact hole portion provided in the layer insulating film 24, a first metallic electrode 28 is formed on the first nickel silicide region 18, so that the first nickel silicide region 18 is connected to the first metallic electrode 28. The first metallic electrode is, for example, aluminum (Al).

A titanium (Ti) or titanium nitride layer (TiN) layer may be interposed at an interface between the second layer 18b, i.e., the nickel silicide, and the first metallic electrode 28, i.e., the aluminum (Al) film. When such structure is employed, the contact property at the interface is high.

A thin film having thermally stable property such as a titanium nitride (TiN) layer, a tantalum carbide (TaC) layer and a tantalum nitride (TaN) layer may be interposed at an interface between the layer insulating film 24 and the first metallic electrode 28, i.e., aluminum (Al). With this structure, diffusion phenomenon of Al atoms to the layer insulating film 24 is suppressed, and the reliability of the device during high temperature operation can be improved.

The metallic material interposed at the interface between the second layer 18b and the first metallic electrode 28 or at the interface between the first metallic electrode 28 and the layer insulating film 24 may be generally a metal or an intermetallic compound having diffusion barrier properties for Al or Cu. The metallic material may be ensured to have such a film thickness thereof as to sufficiently suppress diffusion of Al atoms in light of thermal step during device fabrication processes and the device heat at which the device is actually operated.

A silicon nitride film (which may be hereinafter also referred to as SiN) may be formed to cover the layer insulating film 24. The SiN is more resistant to hydrogen fluoride than SiO$_2$. Therefore, during diluted hydrofluoric acid treatment performed as preprocessing prior to nickel sputtering step during manufacturing process, this can prevent the contact hole size from deviating from the design value.

During the aluminum deposition process of the first metallic electrode 28, it is also necessary to perform the diluted hydrofluoric acid treatment for removing the oxide film formed on the surface of the nickel silicide. In such case, the contact hole extends to a silicide non-formed region. The structure for forming the silicon nitride film (hereinafter referred to as SiN) covering the layer insulating film 24 is also effective as means for solving this problem.

In order to achieve the above effects, the SiN film thickness is preferably 5 nm or more. No problem in the device characteristics would be caused as long as the maximum film thickness thereof is within a sufficiently small range with respect to the size of area of the contact hole. From the perspective of ease in terms of manufacturing method, it is preferably 50 nm or less.

On the $n^+$-type SiC layer 10a, i.e., the back surface side of the SiC substrate 10, for example, a second nickel silicide region 30 is formed.

Further, on the second nickel silicide region 30, a second metallic electrode 32 is formed. The second metallic electrode 32 functions as a drain electrode. The second metallic electrode is, for example, an aluminum (Al) film.

Hereinabove, a silicon oxide film has been explained as an example of the gate insulating film 20, but examples of gate insulating film materials other than the silicon oxide film include high dielectrics such as $Si_3N_4$, $Al_2O_3$, $Ta_2O_5$, $TiO_2$, $La_2O_5$, $CeO_2$, $ZrO_2$, $HfO_2$, $SrTiO_3$, and $Pr_2O_3$. In addition, a material including a combination of high dielectrics such as LaAl oxides may be used. Alternatively, silicate, i.e., a material obtained by mixing metal ions to a silicon oxide, may be used.

In addition, a silicon oxide film and a high dielectric film may be stacked, and a threshold value may be adjusted with an interface dipole and fixed charges formed in the film and the interface. Introduction of nitrogen, hydrogen, and the like to the gate insulating film and the interface thereof is effective for reducing the fixed charges and the interface trap concentration in the gate insulating film and the interface thereof, which may cause degradation of the device characteristics. For example, introduction of nitrogen is performed at a necessary position with an appropriate concentration in accordance with the performance and the film thickness of the gate insulating film required for the device, e.g., methods with $NH_3$ and $NO_2$ gases and nitrogen made into plasma.

For the gate insulating film, materials having heat-resistance required by transistors of respective generations and manufacturing processes thereof may be selected as necessary and used.

In the above example, nickel (Ni) is explained as an example of metal for forming the metal silicide of the source electrode and the well electrode. However, the metal for forming the metal silicide is not limited to the nickel. A metal for forming silicide with solid phase reaction with SiC upon thermal treatment may be used as necessary according to the form of a device.

For example, a stacked structure or an alloy of metal preferentially reacting with carbon (C) in reaction with SiC such as Ni/Ti and Ni—Ti alloys may be used.

The reaction between SiC and metal is performed at a temperature higher than the reaction temperature between Si and metal, and this may deteriorate the device characteristics manufactured according to this thermal treatment. In this case, the reaction temperature may be reduced by including, e.g., Si and Ge in the metal for forming the silicide. The composition ratio between Si, Ge and the metal for forming the silicide may be adjusted by controlling the temperature, the time, and the like of thermal treatment according to a work function of the electrodes required in the device. Examples of metals for forming the metal silicide include not only Ni but also Pd, Pt, Co, Ta, Hf, and Zr.

Subsequently, a manufacturing method of the DIMOSFET 100 according to the present embodiment as shown in FIG. 1 will be explained. FIGS. 2 to FIG. 7 are cross sectional schematic diagrams illustrating steps of the method for manufacturing the semiconductor device according to the present embodiment.

The manufacturing method of the DIMOSFET 100 of the semiconductor device according to the present embodiment includes the steps of preparing a semiconductor substrate having a first n-type silicon carbide layer and a second n-type silicon carbide layer of which n-type impurity concentration is less than that of the first n-type silicon carbide layer, forming a first p-type impurity region on the second n-type silicon carbide layer, forming an n-type impurity region on the second n-type silicon carbide layer, forming a second p-type impurity region connected to the first p-type impurity region and having a depth shallower than that of the first p-type impurity region and having a p-type impurity concentration higher than that of the first p-type impurity region, forming a gate insulating film extending over surfaces of the second n-type silicon carbide layer, the first p-type impurity region, and the n-type impurity region, forming a gate electrode on the gate insulating film, breaking at least a portion of silicon (Si)-carbon (C) bonding of the surface region of the n-type impurity region and the second p-type impurity region, forming a metallic film on the n-type impurity region and the second p-type impurity region, forming a metal silicide by reacting the silicon carbide of the n-type impurity region and second p-type impurity region and the metallic film by thermal treatment, and forming a metallic electrode on the metal silicide on the n-type impurity region and the second p-type impurity region.

First, the SiC substrate (semiconductor substrate) is prepared. The SiC substrate (semiconductor substrate) includes the 4H—SiC $n^+$-type SiC layer (first n-type silicon carbide layer) 10a and the 4H—SiC $n^-$-type SiC layer (second n-type silicon carbide layer) 10b of which n-type impurity concentration is less than that of the $n^+$-type SiC region 10a.

The thickness of the $n^-$-type SiC layer (second n-type silicon carbide layer) 10b is, for example, 10 μm, and is formed using an epitaxial growth method on the $n^+$-type SiC layer (first n-type silicon carbide layer) 10a.

Subsequently, in the $n^-$-type SiC layer 10b, the p-type impurity region (first p-type impurity region) 12 is formed by, for example, thermal treatment (annealing) with Al ion implantation and activation. In addition, in the $n^-$-type SiC layer 10b, the $n^+$-type SiC region (n-type impurity region) 14 is formed by, for example, thermal treatment (annealing) with P ion implantation and activation.

Figure 2:
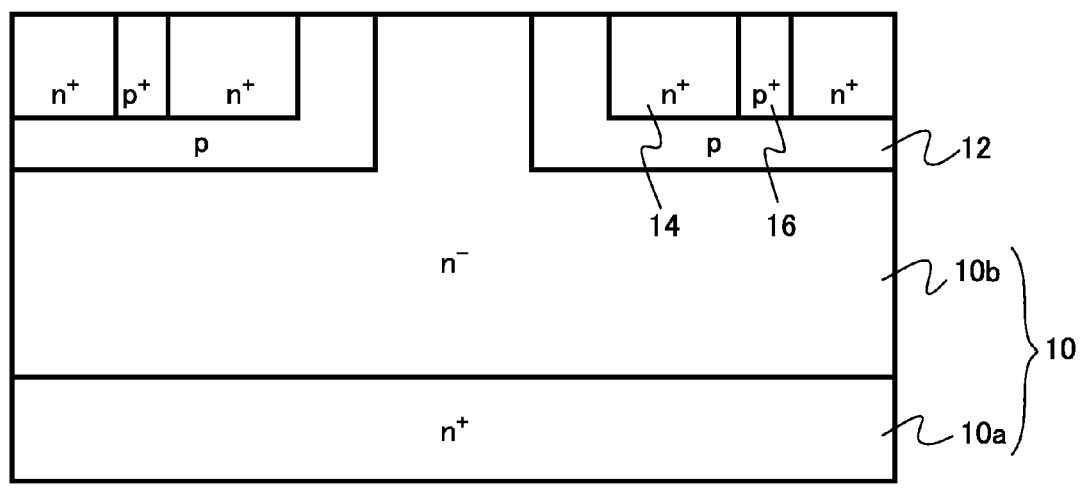
FIG. 2 is a cross sectional schematic diagram illustrating a step of a method for manufacturing the semiconductor device according to the first embodiment.

Subsequently, in the $n^-$-type SiC layer 10b, the $p^+$-type SiC region (second p-type impurity region) 16 is formed. The $p^+$-type SiC region (second p-type impurity region) 16 is connected to the p-type SiC region 12, has a depth shallower than the p-type SiC region 12, and has a higher p-type impurity concentration than the p-type SiC region 12. The $p^+$-type SiC region 16 is formed by, for example, thermal treatment (annealing) with Al ion implantation and activation (FIG. 2).

In the ion implantation for forming the p-type impurity region (first p-type impurity region) 12, the $n^+$-type SiC region (n-type impurity region) 14, and the $p^+$-type SiC region (second p-type impurity region) 16, it is effective to increase the substrate temperature during the ion implantation in order to suppress the degradation of SiC crystallinity caused by physical damage during the ion implantation, and in this case the range of the substrate temperature is desirably within 400 to 650° C.

Subsequently, using a known method, the gate insulating film 20 made of, for example, a silicon oxide film, is formed to extend over the $n^-$-type SiC layer 10b, the p-type SiC region 12, and the $n^+$-type SiC region 14. Then, on the gate insulating film 20, for example, the gate electrode 22 of the polycrystal n-type silicon is formed by photolithography and anisotropic etching and isotropic etching.

Figure 3:
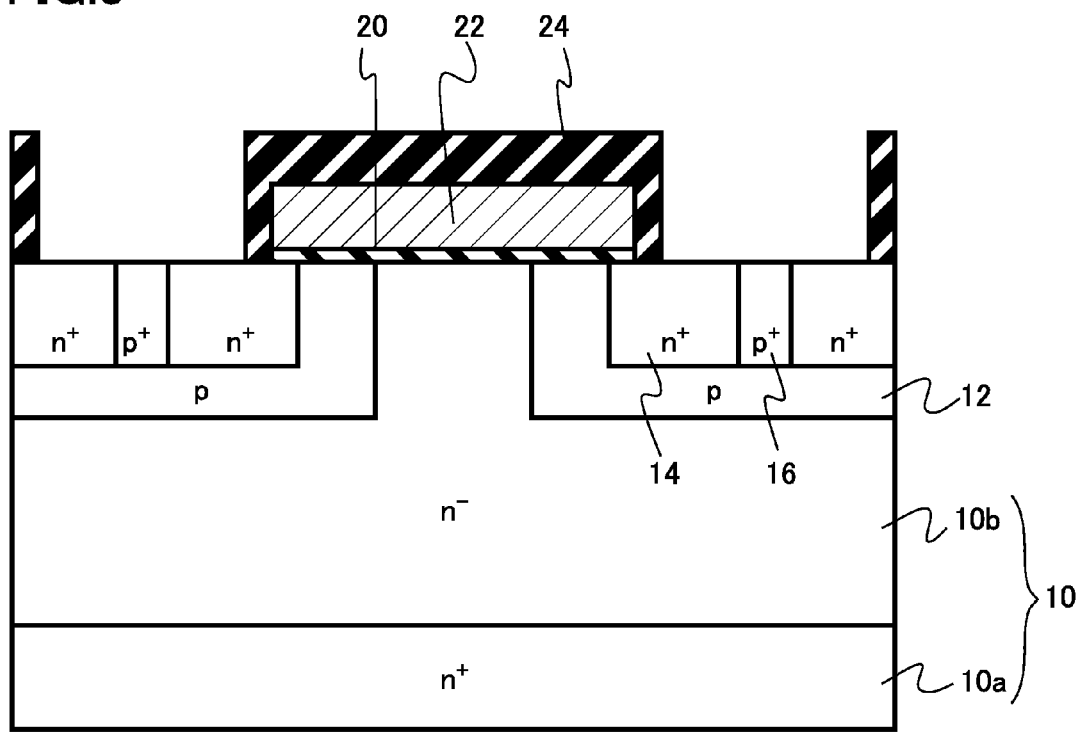
FIG. 3 is a cross sectional schematic diagram illustrating a step of the method for manufacturing the semiconductor device according to the first embodiment.

Further, on the gate electrode 22, a layer insulating film 24 is formed. The layer insulating film 24 is, for example, a silicon oxide film, and is formed by, for example, CVD (Chemical Vapor Deposition) method. On the layer insulating film 24, the contact holes are formed by photolithography and anisotropic etching so that the $n^+$-type SiC region 14 and the $p^+$-type SiC region 16 are exposed (FIG. 3).

Subsequently, for example, ion implantation of germanium (Ge) is performed. With this ion implantation, physical damage is applied to SiC in proximity to the surface of the $p^+$-type SiC region 16 and the $n^+$-type SiC region 14 exposed on the bottom portions of the contact holes, so as to break at least a portion of silicon (Si)-carbon (C) bonding of SiC in proximity to the surface.

Figure 4:
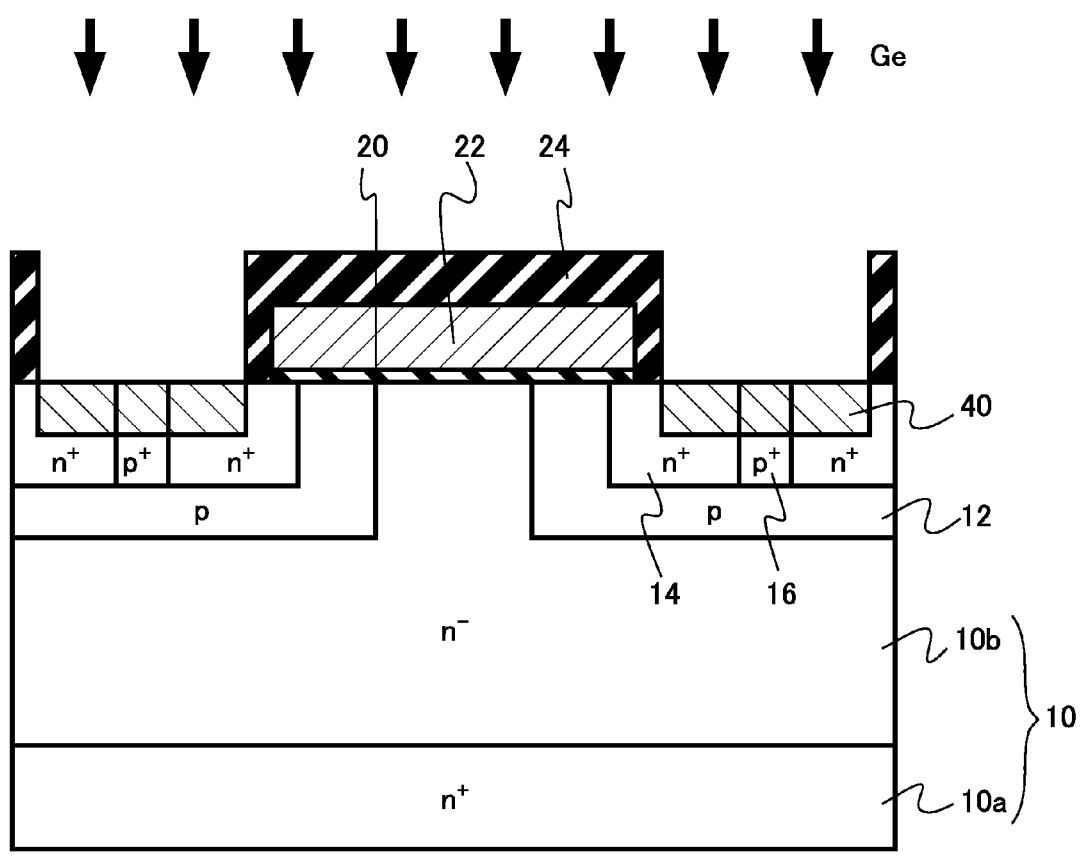
FIG. 4 is a cross sectional schematic diagram illustrating a step of the method for manufacturing the semiconductor device according to the first embodiment.

With this ion implantation, at least a portion of silicon (Si)-carbon (C) bonding is broken, and a damage layer 40 having crystal defects introduced therein is formed (FIG. 4).

Ion species are preferably selected from elements that can efficiently give physical damage to SiC and less likely to affect the device characteristics. Elements such as Germanium (Ge), silicon (Si), chemically stable noble gas elements such as argon (Ar) and xenon (Xe) may be used.

When the substrate is cooled with, e.g., liquid nitrogen, during the ion implantation, this suppresses the effect of crystal recover caused by increase of the substrate temperature during the ion implantation, which can cause physical damage efficiently. In this case, crystal defects can also be easily introduced using light element ion such as carbon (C) and the like.

The energy of the ion implantation may be determined so that the damage layer 40 has a desired thickness in view of the film thickness of the metal silicide formed later. All the damage layer 40 having crystal defects introduced therein due to the damage of the ion implantation is desirably taken into the metal silicide during the step of forming the metal silicide below.

When the damage layer 40 having the crystal defects introduced therein remains even after the metal silicide is formed, the junction leak current given via the crystal defects may damage the device characteristics. Therefore, the thickness of the damage layer 40 is desirably less than the depth twice the thickness of the metallic film deposited for forming the metallic silicide film explained below, and is desirably less than 1.5 times the thickness.

The defect density of the damage layer 40 having the crystal defects introduced therein is desirably equal to or more than $1e17$ $cm^{-3}$, and more preferably, it is equal to or more than $1e18$ $cm^{-3}$.

On the other hand, the damage layer 40 desirably, partially maintains the crystalline structure thereof, and it is desirable not to have a complete amorphous layer. In other words, the step of breaking at least a portion of the silicon (Si)-carbon (C) bonding is desirably performed to an extent such that the silicon carbide is not made into amorphous state.

When the damage layer 40 becomes a complete amorphous layer, layers having different carbon concentrations may not be sufficiently formed during formation of the metal silicide. Therefore, the dose and energy during the ion implantation step are desirably controlled within a range that the damage layer 40 formed with the silicide is not made into amorphous state. The range of the condition is required to be determined in light of the mass of implanted ion species. When Ge is used as ion implantation species, the amount of doze is desirably between $1e13$ $cm^{-2}$ and $2e14$ $cm^{-2}$, inclusive. During the ion implantation step, an oxide film and the like may be used as an ion implantation through film in the implantation region. In such case, according to the film thickness of the through film, it is necessary to adjust the amount of dose and energy of the ion implantation, and it does not necessarily stay within the amount of dose explained above.

It should be noted that the method for forming the damage layer 40 is not limited to the ion implantation as long as at least a portion of the silicon (Si)-carbon (C) bonding of SiC can be physically broken.

Subsequently, the metal silicide is formed on the $n^+$-type SiC region (n-type impurity region) 14 and the $p^+$-type SiC region (second p-type impurity region). Hereinafter, for example, a case will be explained where the metal silicide is nickel silicide.

For example, the nickel silicide is formed according to the following method.

Figure 5:
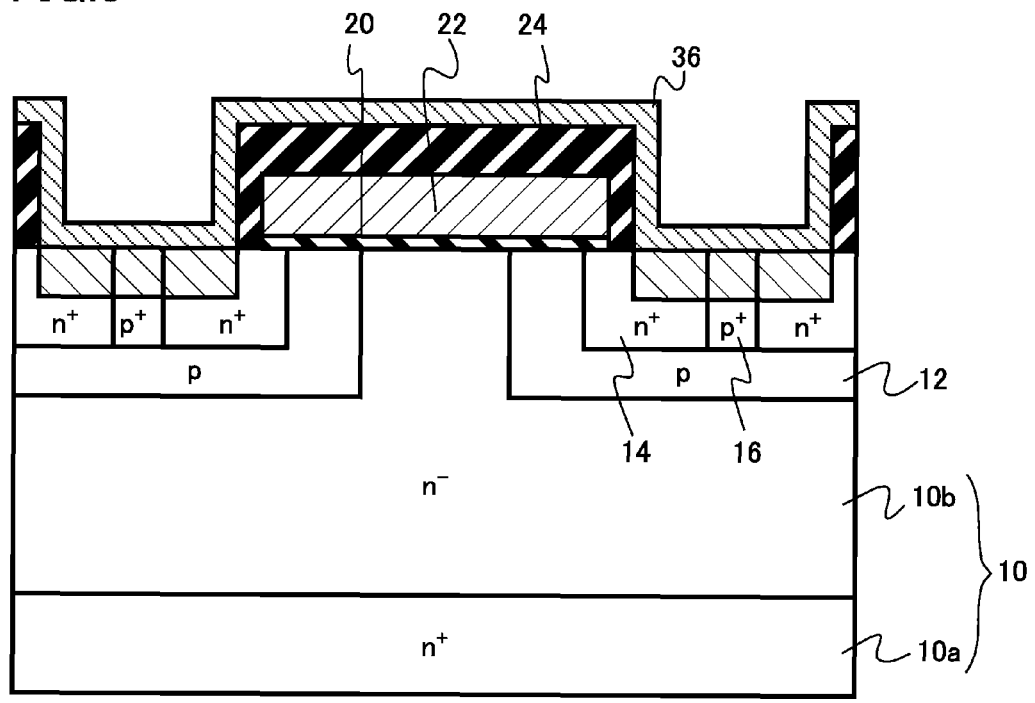
FIG. 5 is a cross sectional schematic diagram illustrating a step of the method for manufacturing the semiconductor device according to the first embodiment.

First, the preprocessing is performed with the diluted hydrofluoric acid. Thereafter, on the $n^+$-type SiC region (n-type impurity region) 14 and the $p^+$-type SiC region (second p-type impurity region) 16, i.e., on the damage layer 40, the nickel film 36 is deposited as the metallic film by sputtering method (FIG. 5).

Then, for example, annealing is performed at 600° C. so as to have the silicon carbide of the $n^+$-type SiC region 14 and the $p^+$-type SiC region 16 react with the nickel film 36, whereby the nickel silicide film (first nickel silicide region) 18 is formed. Solid phase reaction occurs due to interdiffusion between the nickel and the silicon carbide of the damage layer 40 having the crystal defects introduced by the ion implantation performed previously, whereby in the nickel silicide film 18, the first layer (high carbon concentration layer) 18a at the lower portion thereof and the second layer (low carbon concentration layer) 18b having a carbon ratio lower than that of the first layer 18a are formed.

Figure 6:
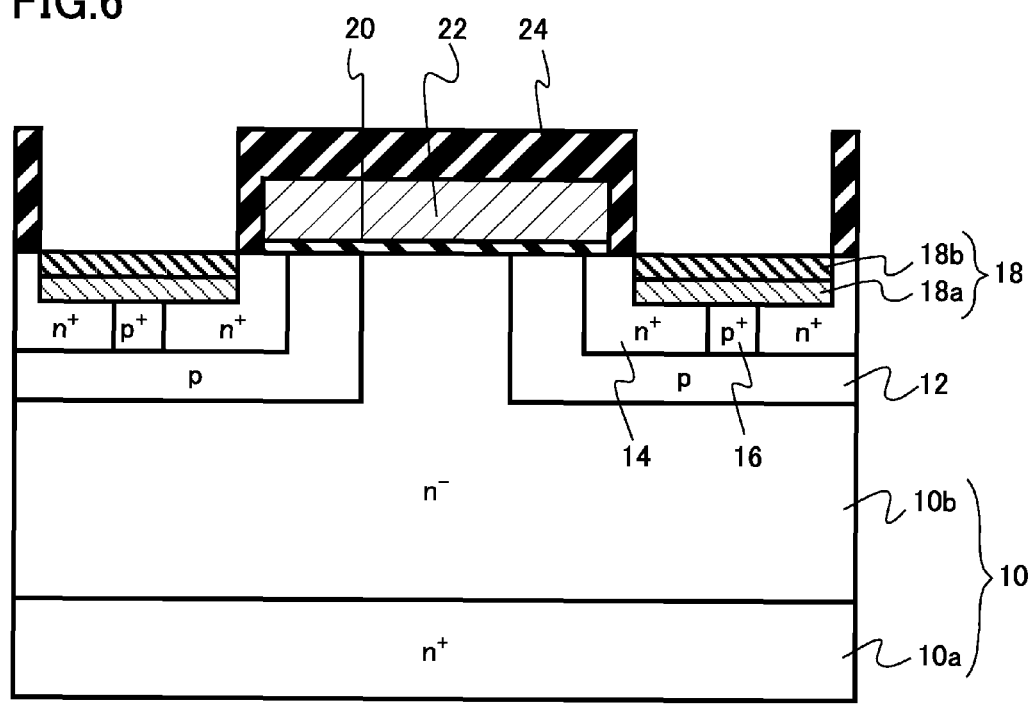
FIG. 6 is a cross sectional schematic diagram illustrating a step of the method for manufacturing the semiconductor device according to the first embodiment.

At this occasion, as described above, all the damage layer 40 is desirably taken into the nickel silicide film 18. Thereafter, the unreacted nickel film is removed with, for example, a mixed solution of sulfuric acid and hydrogen peroxide (FIG. 6).

When the nickel silicide film 18 is formed, a titanium (Ti) film may be deposited as a cap layer on the nickel film 36. In this case, the titanium (Ti) film serves as an absorption layer of carbons (C), and in addition, the titanium (Ti) film also improves heat resistance of the nickel (Ni) film, and the morphology of nickel silicide film 18 ultimately formed is made flat.

Figure 7:
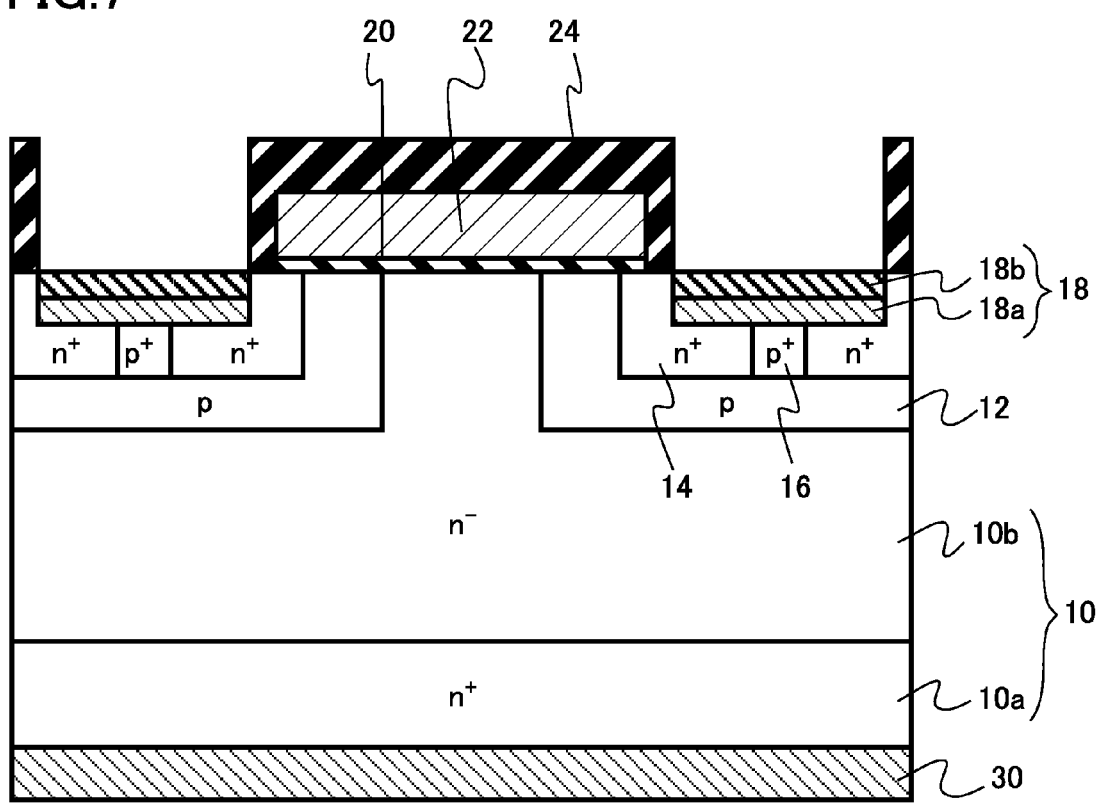
FIG. 7 is a cross sectional schematic diagram illustrating a step of the method for manufacturing the semiconductor device according to the first embodiment.

Subsequently, on the $n^+$-type SiC layer 10a, i.e., on the back surface side of the SiC substrate 10, the nickel silicide film (second nickel silicide region) 30 is formed (FIG. 7). At this occasion, from the perspective of reducing the carbon concentration precipitated on the surface, the film thickness of the nickel film deposited on the back surface is desirably equal to or more than 50 nm.

In the method of forming the metal silicide on the back surface, it is necessary to perform the method under such a condition that the interfacial characteristics become ohmic resistance. In a typical case, a thermal treatment at 800° C. or more is preferable. However, alternatively, when metal species capable of achieving ohmic characteristics at a low temperature are used, or when low-temperature ohmic techniques such as impurity segregation techniques are used, the temperature is not limited to the above temperature range. According to the characteristics of each electrode material, optimal thermal treatment condition may be used. When it is better to form a metal silicide on the back surface side before the metal silicide of the substrate surface in view of the process temperature and the like, the order of process may be switched.

Thereafter, on the first nickel silicide region 18, the first metallic electrode 28 is formed by, e.g., sputtering aluminum. Then, on the second nickel silicide region 30, the second metallic electrode 32 is formed by, for example, sputtering aluminum.

According to the manufacturing method as described above, the DIMOSFET 100 as shown in FIG. 1 is formed.

Figure 8A:
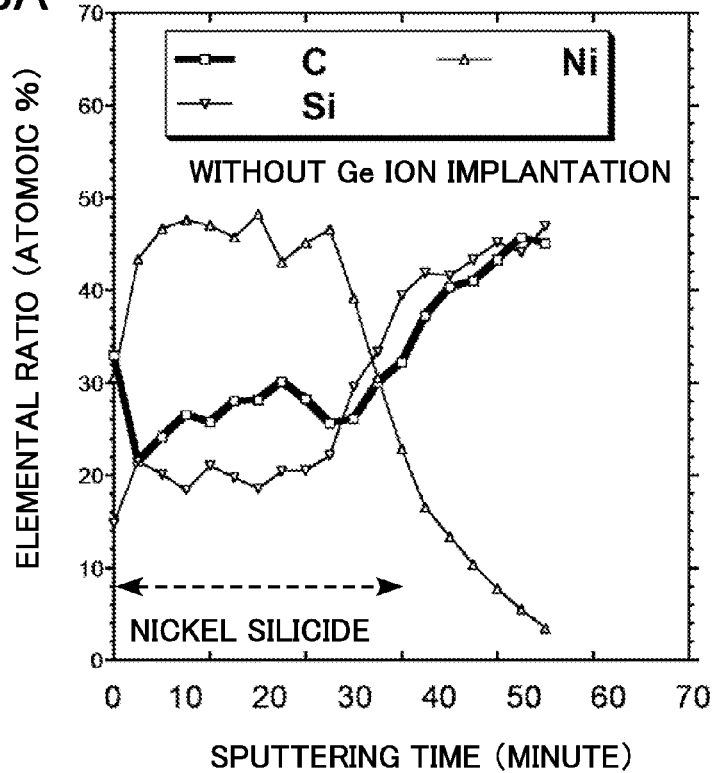
FIGS. 8A, 8B are figures illustrating elemental ratios in the nickel silicide film according to the first embodiment.
Figure 8B:
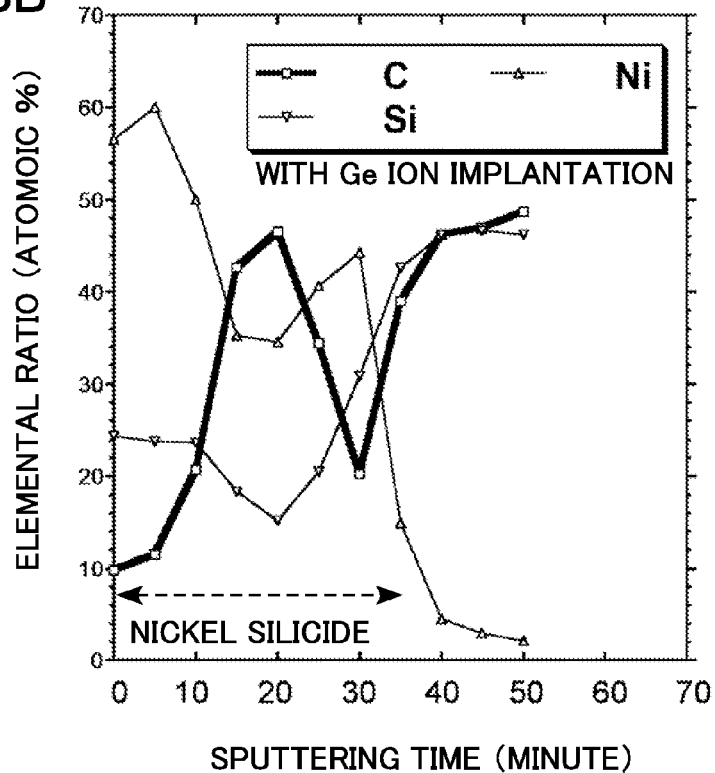

FIGS. 8A, 8B are figures illustrating elemental ratios in the nickel silicide film according to the present embodiment. They are analysis results of Auger Electron Spectroscopy (AES) of nickel (Ni), silicon (Si), and carbon (C) in the nickel silicide film in the depth direction. Zero sputtering time corresponds to the surface of the nickel silicide film, i.e., zero depth.

FIG. 8A shows a case where Ge ion implantation is not performed and the damage layer is not formed. FIG. 8B shows a case where Ge ion implantation corresponding to the present embodiment is performed and the damage layer is formed.

When the Ge ion implantation is not performed, the composition ratio of carbon in the nickel silicide film is about 20 to 30 atomic %, and it is confirmed that the surface of the nickel silicide also has about the same carbon ratio.

On the other hand, when the Ge ion implantation according to the present embodiment is performed, the carbon ratio on the surface of the nickel silicide film is about 10 atomic %, which is low concentration. The high carbon concentration region in which the carbon ratio is 40 atomic % or more is formed in the lower layer portion of the nickel silicide film, i.e., at the side of the SiC substrate. Thus, the low carbon concentration layer in proximity to the surface of the nickel silicide film and the high carbon concentration layer of the SiC substrate are formed.

As described above, in the present embodiment, the carbon ratio on the surface of the nickel silicide film is low, and this improves the contact property with the metallic electrode formed on the nickel silicide film.

Figure 9:
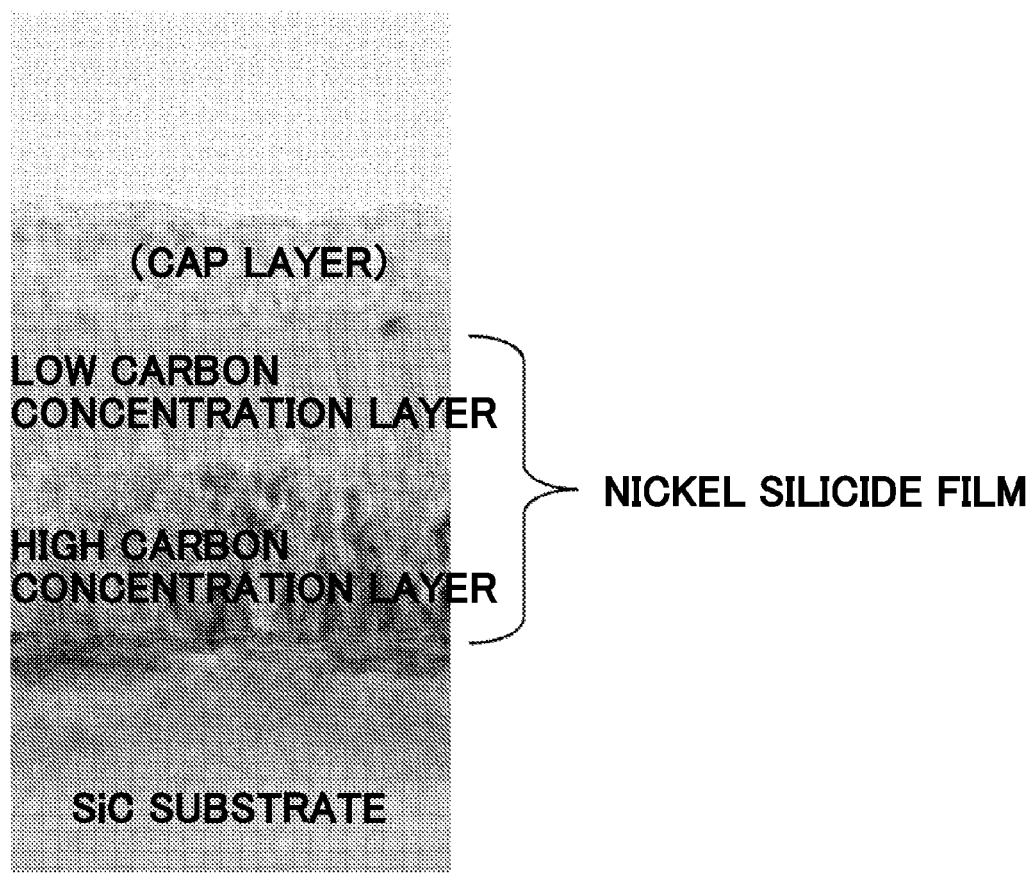
FIG. 9 is a cross-sectional picture illustrating the nickel silicide film according to the first embodiment.

FIG. 9 is a cross-sectional picture illustrating the nickel silicide film according to the present embodiment. FIG. 9 shows observation results with a transmission electron microscope.

In this case, using the titanium (Ti) film as a cap layer formed on the surface of the nickel film, the nickel silicide film is formed. It is confirmed that the titanium carbide (TiC layer) is formed at the top portion. This layer can be released in an unreacted nickel removing step using a mixed solution including sulfuric acid and hydrogen peroxide.

It s confirmed that the nickel silicide film is separated into two layers having different average grain diameters. The two layers having different carbon ratios (carbon concentrations) in the above AES analysis correspond thereto.

It is understood from FIG. 9 that the low carbon concentration layer (second layer 18b) in the upper layer of the nickel silicide film forms one crystal grain in the film thickness direction. This is a so-called bamboo structure. With this kind of bamboo structure, the electric resistance component caused by a grain boundary surface can be reduced, and the film has a small specific resistance.

On the other hand, the high carbon concentration layer (first layer 18a) in the lower layer has many crystal grains in the film thickness direction. This crystal grains includes mixed crystal grains of the nickel silicide and the carbon. By using this kind of structure, the carbon is stabilized in the high carbon concentration layer (first layer 18a), and this achieves suppressing diffusion in the nickel silicide surface direction.

As described above, the average grain diameter of the nickel silicide in the low carbon concentration layer (second layer 18b) is more than the average grain diameter of the nickel silicide in the high carbon concentration layer (first layer 18a). In this specification, the grain diameter is defined as a value obtained by measuring the maximum diameter and the minimum diameter of a grain with a transmission electron microscope and the like and obtaining an average value thereof. The average grain diameter is an average value of grain diameters measured for many grains.

In the present embodiment, two layers having different average grain diameters and carbon ratios are provided in the nickel silicide film, so that the specific resistance of the nickel silicide layer is reduced, and the diffusion of the carbon is suppressed. Therefore, according to the present embodiment, the DIMOSFET 100 can be achieved with high contact characteristics and reliability.

Figure 10:
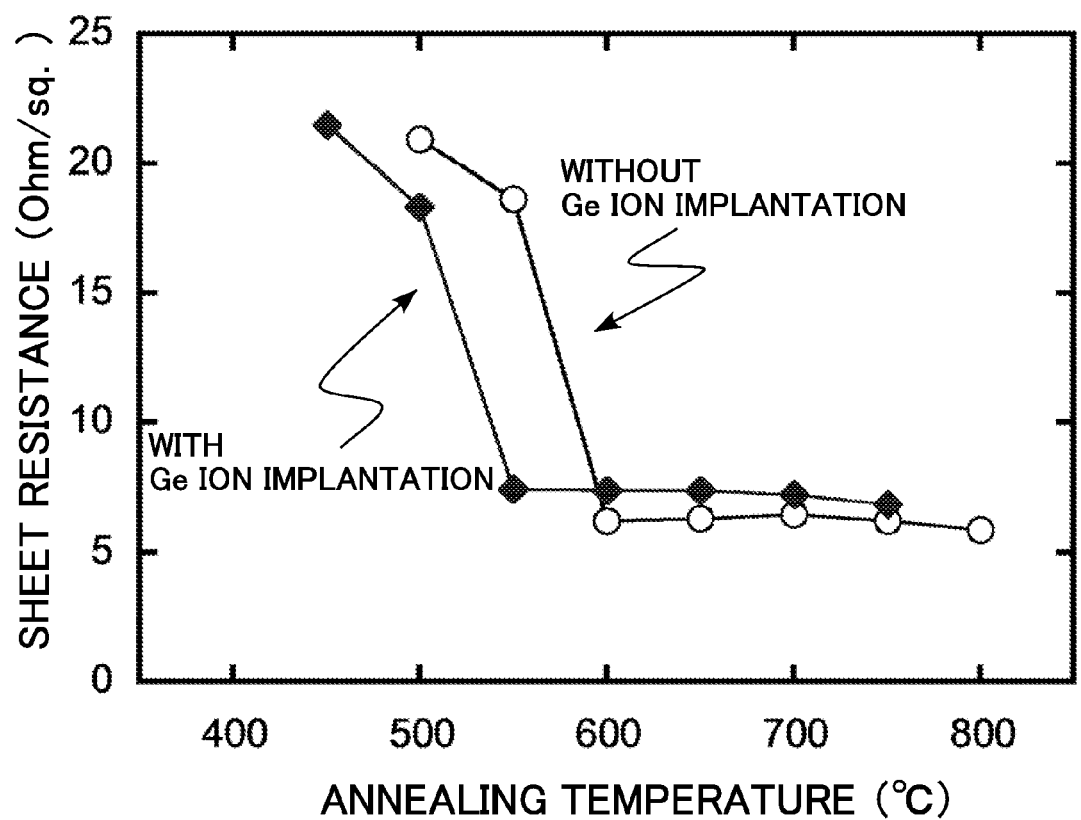
FIG. 10 is a figure illustrating relationship between a thermal treatment temperature and a sheet resistance during formation of the nickel silicide film according to the first embodiment.

FIG. 10 is a figure illustrating relationship between a thermal treatment (annealing) temperature and a sheet resistance during formation of the nickel silicide according to the present embodiment. This shows temperature dependency of the sheet resistance of the nickel silicide film during nickel silicide formation thermal treatment (annealing) in a case where the Ge ion implantation corresponding to the present embodiment is performed and a case where it is not performed.

In any case, with thermal treatment, the sheet resistance decreases. This is caused by change of specific resistance caused by phase change from Ni rich phase to $Ni_2Si$ phase. This $Ni_2Si$ is highly resistant to acid solution, and it is easy to perform selective etching from unreacted Ni on the insulating film.

As compared with the case where the Ge ion implantation is not performed, when the Ge ion implantation is performed, change to the low resistance $Ni_2Si$ phase occurs with thermal treatment performed at a lower temperature, and the value of the sheet resistance (Rs) is saturated. From this fact it is confirmed that the phase completely changes to the $Ni_2Si$ phase in thermal treatment performed at 550° C.

That is, the process of introducing defects into the SiC according to the present embodiment also has the effect of lowering the silicide formation temperature. As can be understood from this, simultaneous formation of a metallic silicide film on the gate polycrystal silicon, which used to be difficult from the viewpoint of thermal resistance thereof, can be easily done as explained later in detail. Still faster operation of the DIMOSFET can be achieved.

As hereinabove explained, in the DIMOSFET 100 according to the present embodiment, the side of the first nickel silicide region 18 at the interface between the first nickel silicide region 18 and the first metallic electrode 28 is the low carbon concentration layer. Therefore, the contact property of the metallic electrode 28 is improved, and high contact characteristics and high reliability are achieved. Since the grain diameter of the high carbon concentration layer in the first nickel silicide region 18 is small, the diffusion of carbons to the surface of the nickel silicide is suppressed. Therefore, from this view point, the contact property of the metallic electrode 28 is improved, and high contact characteristics and high reliability are achieved. Further, since the grain diameter of the low carbon concentration layer in the first nickel silicide region 18 is large, the sheet resistance of the first nickel silicide region 18 can be reduced. In this case, since the resistance of the high carbon concentration layer is high due to small grain size, the total sheet resistance of the first nickel silicide region 18 may be reduced by optimizing the film thicknesses of the high carbon concentration layer and the low carbon concentration layer. Therefore, the parasitic resistance of the DIMOSFET is reduced, and high performance DIMOSFET with a higher ON-current can be achieved. Therefore, the DIMOSFET can be achieved with high performance and high reliability.

According to the manufacturing method of the present embodiment, even when the nickel silicide film is thin, carbon precipitation is less likely to occur on the surface of the nickel silicide, and the nickel silicide film having low carbon concentration can be formed. Therefore, even when the size of the DIMOSFET is reduced, the DIMOSFET can be achieved with high performance and high reliability.

(Second Embodiment)

A semiconductor device according to the present embodiment is the same as the first embodiment except that, instead of the first nickel silicide region formed on the SIC substrate surface, the second nickel silicide region formed on the back surface of the SiC substrate includes a high carbon concentration layer and a low carbon concentration layer. Accordingly, description about the same contents as those of the first embodiment are omitted.

Figure 11:
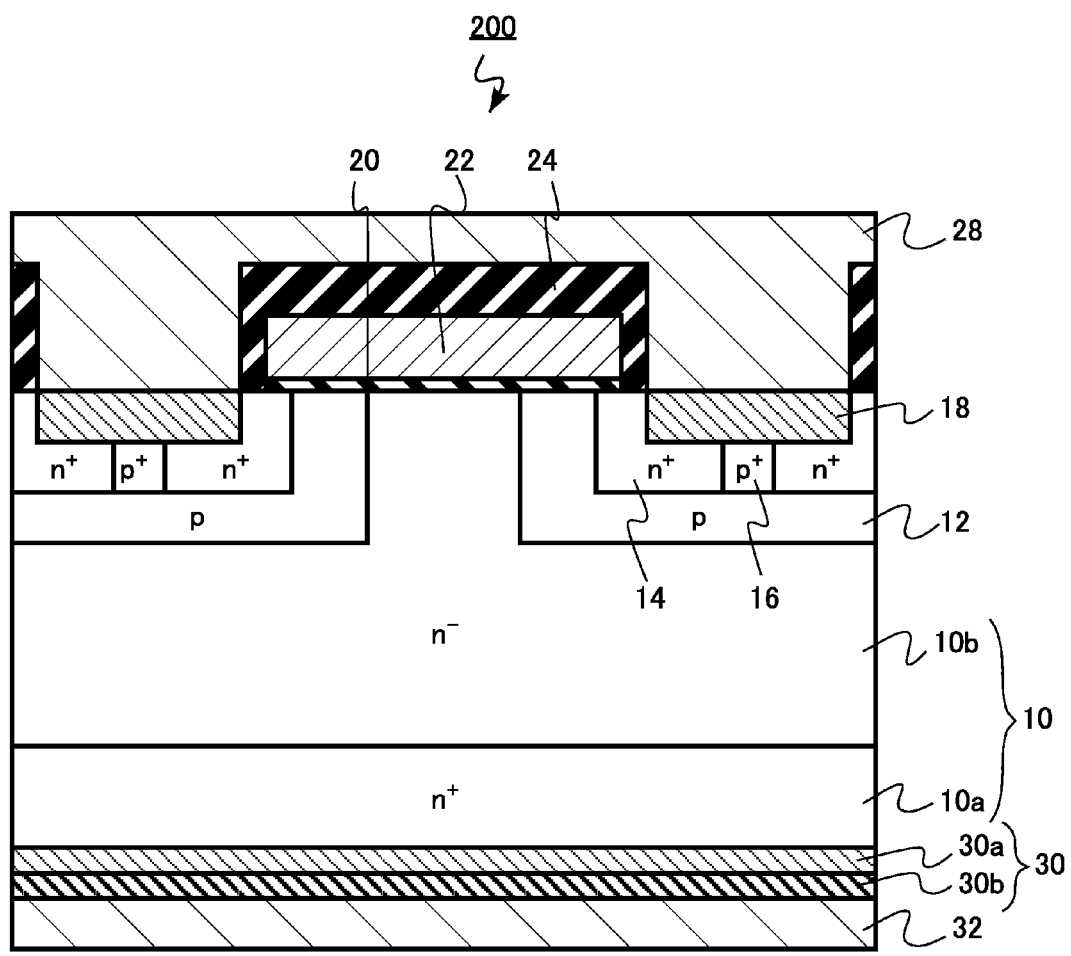
FIG. 11 is a cross sectional schematic diagram illustrating a semiconductor device according to a second embodiment.

FIG. 11 is a cross sectional schematic diagram illustrating a semiconductor device according to the present embodiment. The semiconductor device according to the present embodiment is a DIMOSFET.

As shown in FIG. 11, in a DIMOSFET 200 according to the present embodiment, a second nickel silicide region 30 includes a first layer 30a and a second layer 30b having a carbon ratio (carbon concentration) lower than that of the first layer 30a. The second layer 30b is formed on the first layer 30a, i.e., the second layer 30b is formed at a side away from the n$^+$-type SiC layer 10a with respect to the first layer 30a. The average grain diameter of metal silicide in the second layer 30b is more than the average grain diameter of nickel silicide in the first layer 30a.

According to the present embodiment, the contact property between the second nickel silicide region 30 and the second metallic electrode 32 is improved. The contact resistance of the drain electrode (second metallic electrode 32) is also reduced.

In general, the n-type impurity concentration of the n$^+$-type SiC layer 10a is set at a lower concentration than the n-type impurity concentration of the n$^+$-type SiC region 14, and it is difficult to reduce the contact resistance. According to the present embodiment, since the reaction of the metal silicide formation is accelerated, the ohmic characteristics can be achieved at a relatively low temperature.

When the nickel silicide film (second nickel silicide region) 30 is formed on the back surface side of the SiC substrate 10, the DIMOSFET 200 according to the present embodiment can be manufactured by performing Ge ion implantation before the nickel film is deposited, and forming a damage layer.

Hereinabove, according to the present embodiment, the contact property between the metallic electrode and the metallic silicide film on the back surface side of the SiC substrate is improved. Therefore, the DIMOSFET and the manufacturing method thereof can be achieved with high performance and high reliability.

(Third Embodiment)

A semiconductor device according to the present embodiment is the same as the first embodiment except that, in addition to the first nickel silicide region, the second nickel silicide region formed on the back surface of the SiC substrate includes a high carbon concentration layer and a low carbon concentration layer. Accordingly, description about the same contents as those of the first embodiment are omitted.

Figure 12:
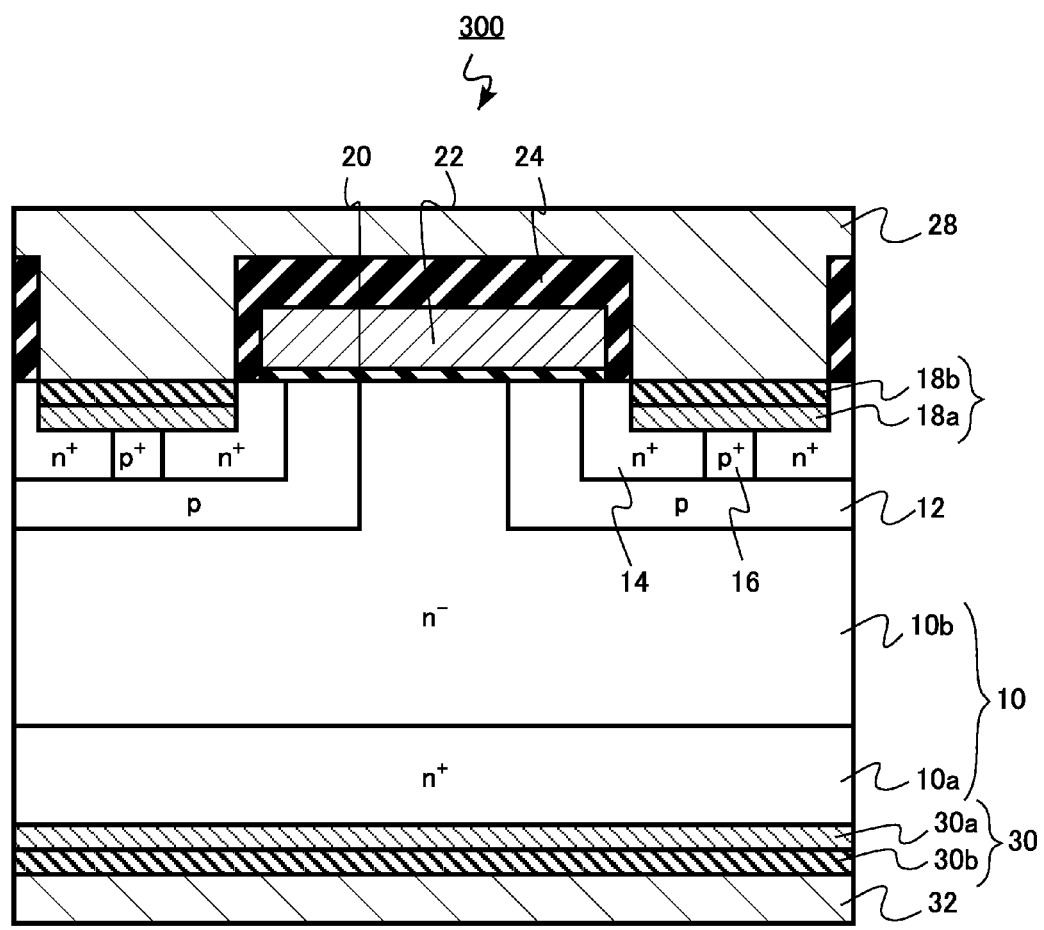
FIG. 12 is a cross sectional schematic diagram illustrating a semiconductor device according to a third embodiment.

FIG. 12 is a cross sectional schematic diagram illustrating a semiconductor device according to the present embodiment. The semiconductor device according to the present embodiment is a DIMOSFET.

As shown in FIG. 12, in a DIMOSFET 300 according to the present embodiment, a second nickel silicide region 30 also includes a first layer 30a and a second layer 30b having a carbon ratio (carbon concentration) lower than that of the first layer 30a. The second layer 30b is formed on the first layer 30a, i.e., the second layer 30b is formed at a side away from the n$^+$-type SiC layer 10a with respect to the first layer 30a. The average grain diameter of metal silicide in the second layer 30b is more than the average grain diameter of nickel silicide in the first layer 30a.

According to the present embodiment, both of the contact property between the first nickel silicide region 18 and the first metallic electrode 28 and the contact property between the second nickel silicide region 30 and the second metallic electrode 32 are improved. The contact resistances of both of the first electrode 18 and the second metallic electrode 32 are reduced.

When the nickel silicide film (second nickel silicide region) 30 is formed on the back surface side of the SiC substrate 10, the DIMOSFET 300 according to the present embodiment can be manufactured by performing Ge ion implantation before the nickel film is deposited, and forming a damage layer, in addition to performing the manufacturing method according to the first embodiment.

Regarding the nickel silicide film thicknesses of the first nickel silicide region 18 and the second nickel silicide region 30, the sputtering film thickness of the nickel film may be adjusted so that desired characteristics are obtained. The nickel silicide film thicknesses of the first nickel silicide region 18 and the second nickel silicide region 30 are set at about the same level, for example, the range of ±100%, the nickel silicide films of the first nickel silicide region 18 and the second nickel silicide region 30 can be relatively easily formed at the same time with the same thermal treatment.

Hereinabove, according to the present embodiment, both of the surface and the back surface of the SiC substrate have higher contact properties between the metallic silicide films and the metallic electrodes. In addition, the resistances of both of the metallic silicide films are reduced. Therefore, the DIMOSFET and the manufacturing method thereof can be achieved with high performance and high reliability.

(Fourth Embodiment)

A semiconductor device according to the present embodiment is the same as the first embodiment except that the gate electrode has a stacked structure of polycrystal silicon and nickel silicide. Accordingly, description about the same contents as those of the first embodiment are omitted.

Figure 13:
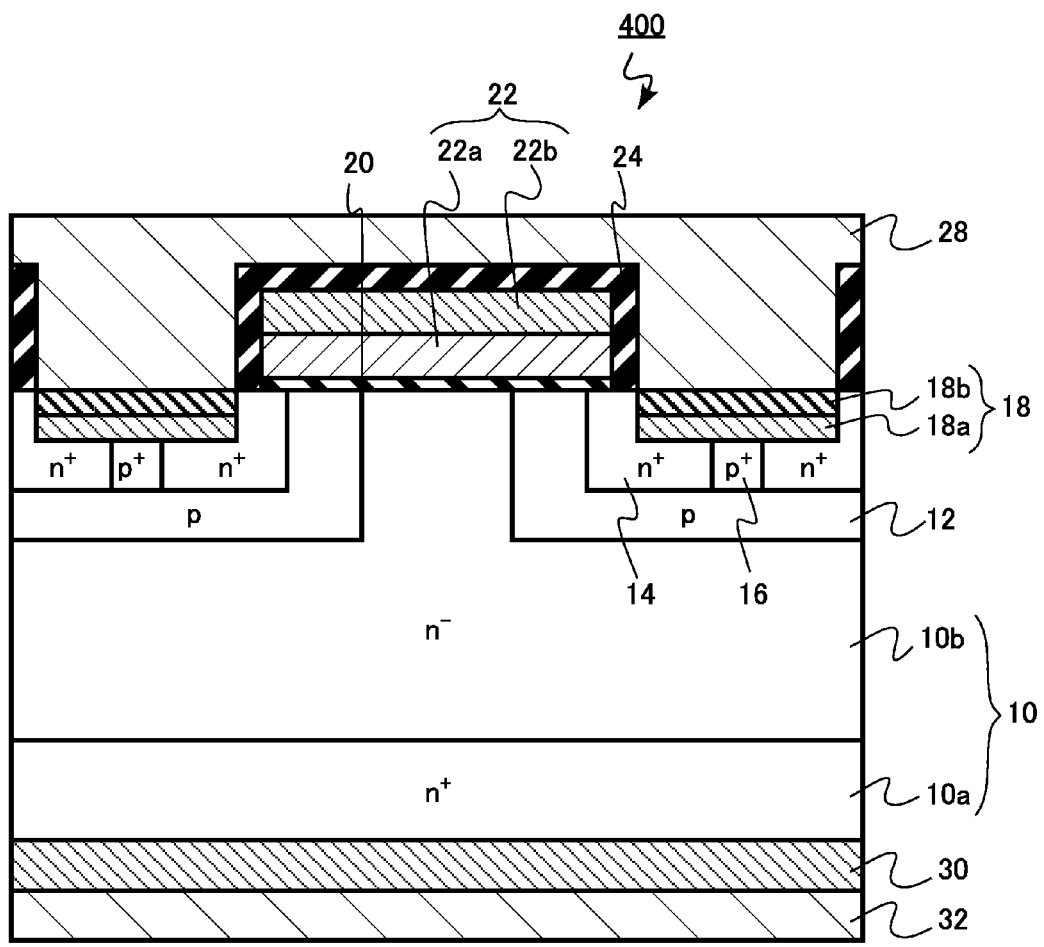
FIG. 13 is a cross sectional schematic diagram illustrating a semiconductor device according to a fourth embodiment.

FIG. 13 is a cross sectional schematic diagram illustrating a semiconductor device according to the present embodiment. The semiconductor device according to the present embodiment is a DIMOSFET.

As shown in FIG. 13, in a DIMOSFET 400 according to the present embodiment, a gate electrode 22 has two-layer structure including a polycrystal silicon layer 22a and a nickel silicide layer 22b. This structure is a so-called salicide (Self Aligned Silicide) structure. The nickel silicide layer 22b is NiSi phase of which Ni:Si ratio is 1:1.

When the gate electrode employs this structure, the sheet resistance of the gate electrode 22 is one tenth or less the sheet resistance where there is only one layer of polycrystal silicon. Accordingly, high frequency operation is achieved with the DIMOSFET 400. This is because the specific resistance of the nickel silicide layer 22b is one tenth or less than that of the polycrystal silicon layer 22a.

The DIMOSFET 400 according to the present embodiment is manufactured as follows. In the step for forming the nickel film on the $n^+$-type SiC region (n-type impurity region) 14 and the $p^+$-type SiC region (second p-type impurity region) 16 in the manufacturing method according to the first embodiment, the polycrystal silicon 22a of the gate electrode 22 is exposed, and the nickel film 36 is formed on the polycrystal silicon 22a at the same time, whereby the DIMOSFET 400 is manufactured.

This manufacturing method is achieved by reducing the nickel silicide film formation temperature explained with reference to FIG. 10. In general, the formation temperature of $Ni_2Si$ highly resistant to acid suitable for salicide step on SiC is 600 degrees or more, and in this temperature region, the NiSi layer formed on the polycrystal silicon is not stabilized and aggregated. Therefore, at the same time as when the $n^+$-type SiC region of the source electrode is formed, it used to be difficult to form silicide on the gate electrode using the same metallic material.

On the other hand, according to formation of the damage layer to SiC, the formation temperature of $Ni_2Si$ on SiC is reduced to a temperature as low as 550° C. (FIG. 10). In this temperature region, the NiSi layer can be formed stably even on the polycrystal silicon, so that the salicide structure as shown in FIG. 13 can be easily achieved.

The film thickness of NiSi phase formed on the polycrystal silicon is uniquely determined according to the thickness of the sputtered nickel film, and therefore, the sputtering film thickness of the nickel film, the junction depth, the depth of the defect inducing region, and the height of the polycrystal silicon layer may be adjusted so as to optimize both of the film thickness of the nickel silicide film of the source electrode and the film thickness of the nickel silicon film formed on the polycrystal silicon.

Hereinabove, according to the present embodiment, in addition to the effects of the first embodiment, this achieves a new effect of improving the performance caused by the decreased sheet resistance of the gate electrode.

(Fifth Embodiment)

A semiconductor device according to the present embodiment is the same as the fourth embodiment except that all of the gate electrode is made of nickel silicide. Accordingly, description about the same contents as those of the fourth embodiment are omitted.

Figure 14:
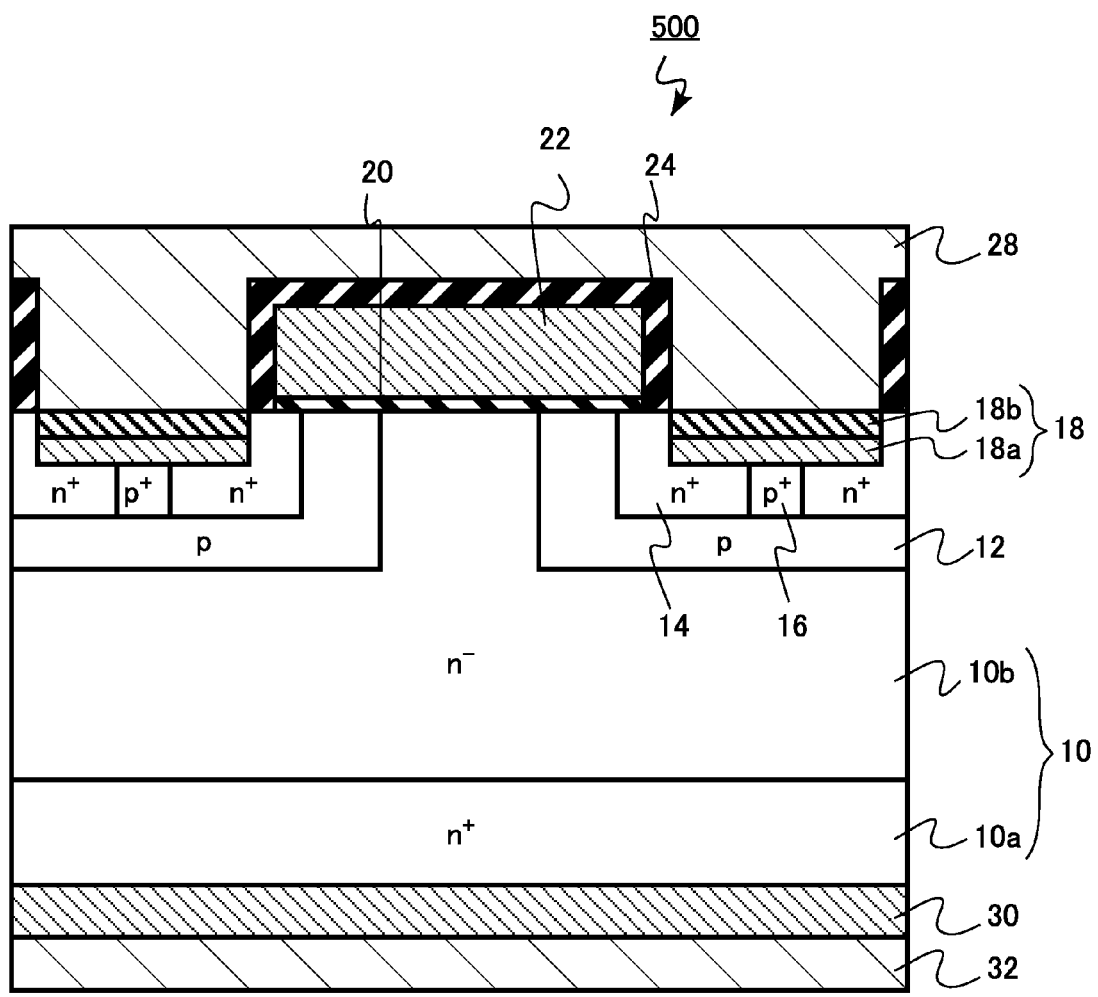
FIG. 14 is a cross sectional schematic diagram illustrating a semiconductor device according to a fifth embodiment.

FIG. 14 is a cross sectional schematic diagram illustrating a semiconductor device according to the present embodiment. The semiconductor device according to the present embodiment is a DIMOSFET.

As shown in FIG. 14, in the DIMOSFET 500 according to the present embodiment, all the gate electrode 22 is made of a nickel silicide layer. The nickel silicide layer is NiSi phase of which Ni:Si ratio is 1:1.

According to the present embodiment, the sheet resistance of the gate electrode 22 can be further reduced as compared with the fourth embodiment.

Like the manufacturing method according to the fourth embodiment, the DIMOSFET 500 according to the present embodiment is manufactured as follows. In the step for forming the nickel film 36 on the $n^+$-type SiC region (n-type impurity region) 14 and the $p^+$-type SiC region (second p-type impurity region) 16, the polycrystal silicon of the gate electrode 22 is exposed, and the nickel film is formed on the polycrystal silicon at the same time, whereby the DIMOSFET 500 is manufactured. Subsequently, with thermal treatment, in the step of forming the nickel silicide film, reaction is performed so that all the polycrystal silicon is made into nickel silicide.

The film thickness of the nickel silicide (NiSi phase) film formed in the portion of the gate electrode 22 is uniquely determined by the film thicknesses of the polycrystal silicon and the nickel film sputtered. Therefore, each film thickness may be set so that all the polycrystal silicon is made into nickel silicide.

When this structure is employed, the threshold voltage of the DIMOSFET 500 increases by about 0.5 V as compared with the gate electrode of the n-type polycrystal silicon single layer. This is because the work function of the NiSi electrode is higher than that of the $n^+$ polycrystal silicon by about 0.5 eV. Accordingly, the normally-OFF DIMOSFET can be easily achieved. When the film thickness ratio between the nickel film and the n-type polycrystal silicon is changed so that the thickness of the nickel film increases, the composition of nickel of the gate electrode increases. Therefore, the threshold voltage can be set at a level up to about 0.3 eV still higher. In this case, the formed silicide phase is $Ni_2Si$ and $Ni_3Si$.

Hereinabove, according to the present embodiment, in addition to the effects of the fourth embodiment, the performance of the DIMOSFET is further improved. In addition, the characteristics can be optimized by adjusting the threshold value of the DIMOSFET.

(Sixth Embodiment)

A semiconductor device according to the present embodiment is different from the first embodiment in that it is not a DIMOSFET but is an IGBT (Insulated Gate Bipolar Transistor). Essential portions of the structure and the manufacturing method of the nickel silicide region are the same as those of the first embodiment. Accordingly, description about the same contents as those of the first embodiment are omitted.

Figure 15:
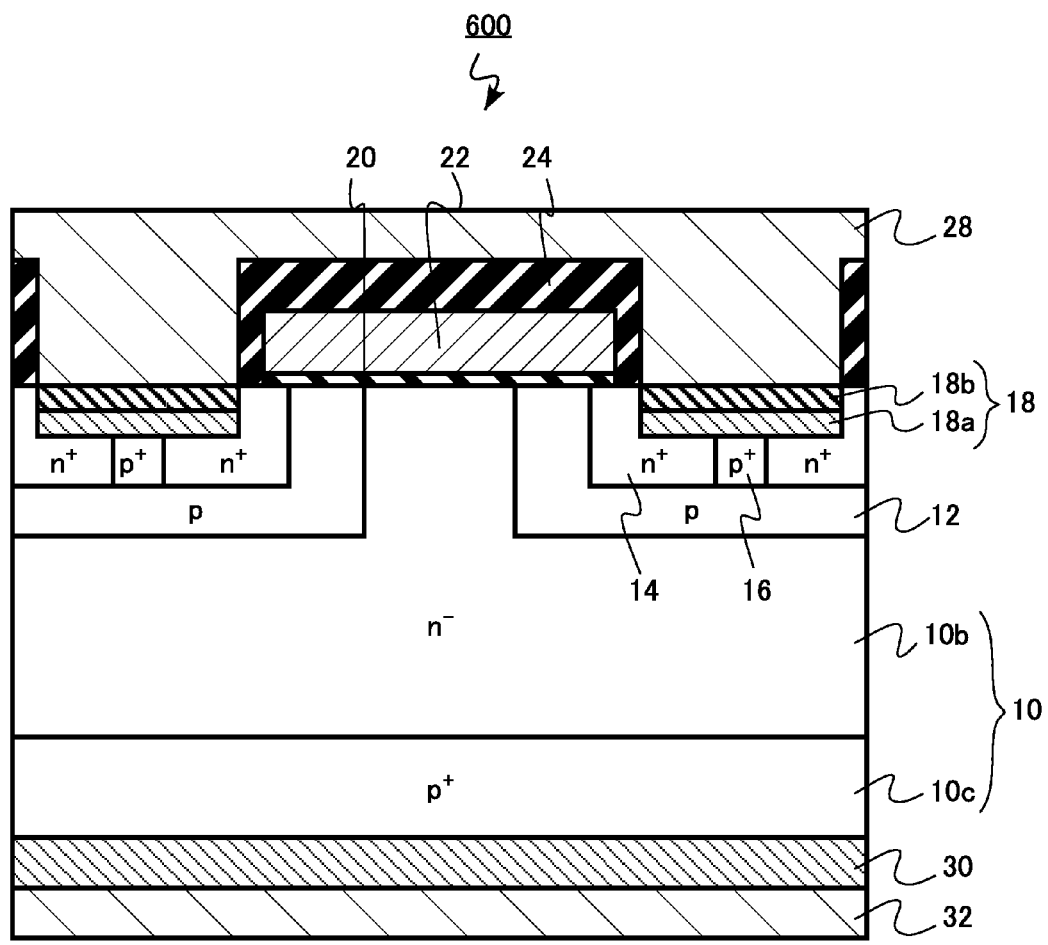
FIG. 15 is a cross sectional schematic diagram illustrating a semiconductor device according to a sixth embodiment.

FIG. 15 is a cross sectional schematic diagram illustrating a semiconductor device according to the present embodiment. The semiconductor device according to the present embodiment is an IGBT.

As shown in FIG. 15, an IGBT 600 uses a SiC substrate 10 of 4H—SiC including a p+-type SiC layer (p-type silicon carbide layer) 10c and an $n^-$-type SiC layer (n-type silicon carbide layer) 10b.

The $p^+$-type SiC layer 10c includes, for example, Al of which impurity concentration is, e.g., about $5\times10^{18}$ to $1\times10^{19}$ $cm^{-3}$ as a p-type impurity. The $p^+$-type SiC layer 10c functions as a collector region for the IGBT 600.

On the $p^+$-type SiC layer 10c, i.e., the back surface side of the SiC substrate 10, a second nickel silicide region 30 and a second metallic electrode 32 are formed as collector electrode.

The first nickel silicide region 18 and the first metallic electrode 28 function as an emitter electrode and a well electrode of the IGBT 600.

The other configurations are the same as those of the first embodiment.

Hereinabove, according to the present embodiment, the carbon concentration on the surface of the metal silicide is reduced, so that the contact property between the metallic silicide film and the metallic electrode is improved, and film peel-off is less likely to occur. Therefore, the contact characteristics and the reliability of the IGBT are improved. In addition, the resistance of the metallic silicide film is reduced, which improves the contact characteristics of the IGBT. Therefore, the IGBT and the manufacturing method thereof can be achieved with high performance and high reliability.

(Seventh Embodiment)

A semiconductor device according to the present embodiment is different from the first embodiment in that it is a PiN (p-intrinsic-n) diode. Essential portions of the structure and the manufacturing method of the nickel silicide region are the same as those of the first embodiment. Accordingly, description about the same contents as those of the first embodiment are omitted.

Figure 16:
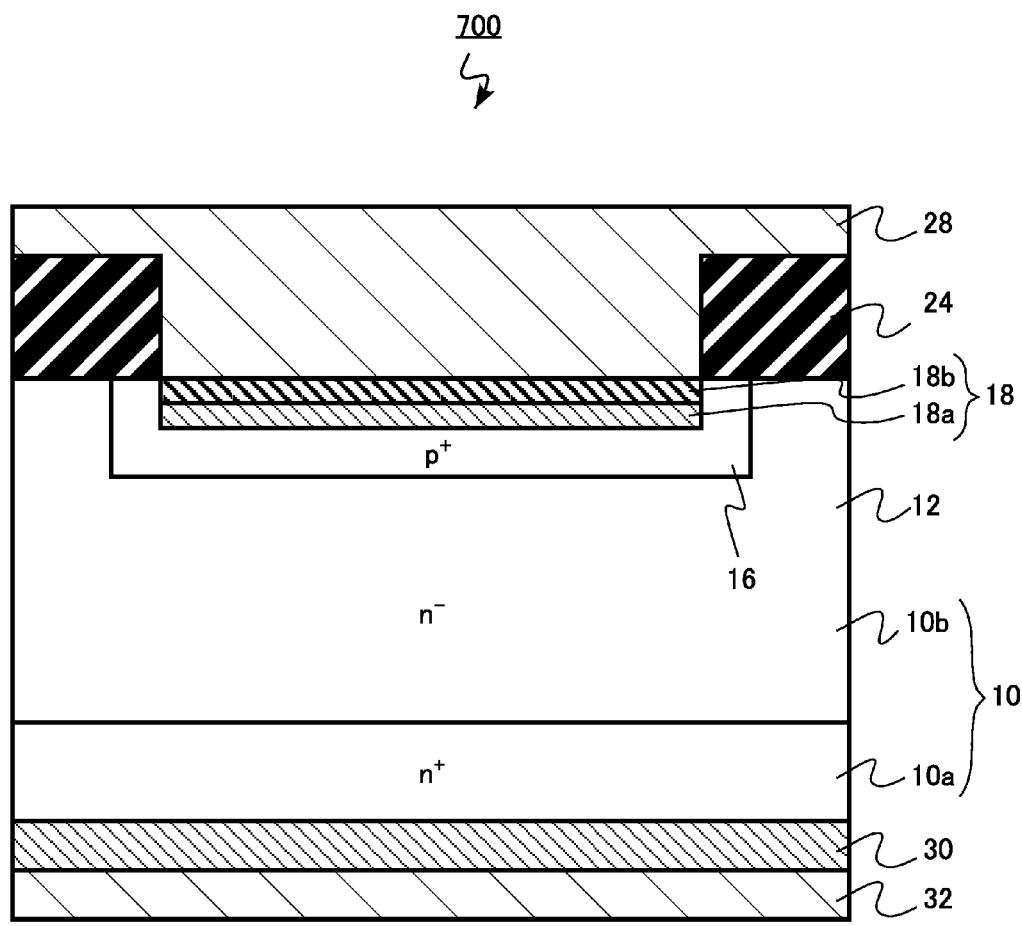
FIG. 16 is a cross sectional schematic diagram illustrating a semiconductor device according to a seventh embodiment.

FIG. 16 is a cross sectional schematic diagram illustrating a semiconductor device according to the present embodiment. The semiconductor device according to the present embodiment is a PiN diode.

As shown in FIG. 16, a PiN diode 700 uses a 4H—SiC substrate 10 including an n+-type SiC layer 10a and an n−-type SiC layer 10b of which n-type impurity concentration is less than that of the n+-type SiC layer 10a.

In the n−-type SiC layer 10b, a p+-type SiC region 16 is formed. The p+-type SiC region 16 functions as an anode region of the PiN diode 700. On the p+-type SiC region 16, a first nickel silicide region (nickel silicide film) 18 is formed.

The first nickel silicide region 18 includes a first layer 18a and a second layer 18b having a carbon ratio (carbon concentration) lower than that of the first layer 18a. The second layer 18b is formed on the first layer 18a, i.e., the second layer 18b is formed at a side away from the p$^+$-type SiC region 16 with respect to the first layer 18a. The average grain diameter of the nickel silicide in the second layer 18b is more than the average grain diameter of the nickel silicide in the first layer 18a.

On the first nickel silicide region, a first metallic electrode 28 made of, e.g., aluminum (Al) is formed as an anode electrode.

The n+-type SiC layer 10a functions as a cathode region of the PiN diode 700. On the n+-type SiC layer 10a, a second nickel silicide region (nickel silicide film) 30 is formed. On the second nickel silicide region 30, a second metallic electrode 32 made of, e.g., aluminum (Al) is provided as a cathode electrode.

Hereinabove, according to the present embodiment, the carbon concentration on the surface of the metal silicide is reduced, so that the contact property between the metallic silicide film and the metallic electrode is improved, and film peel-off is less likely to occur. Therefore, the contact characteristics and the reliability of the PiN diode are improved. In addition, the resistance of the metallic silicide film is reduced, which improves the contact characteristics of the PiN diode. Therefore, the PiN diode and the manufacturing method thereof can be achieved with high performance and high reliability.

(Eighth Embodiment)

A semiconductor device according to the present embodiment is different from the first embodiment in that it is an MPS (Merged PiN and Shottky) diode. Essential portions of the structure and the manufacturing method of the nickel silicide region are the same as those of the first embodiment. Accordingly, description about the same contents as those of the first embodiment are omitted.

Figure 17:
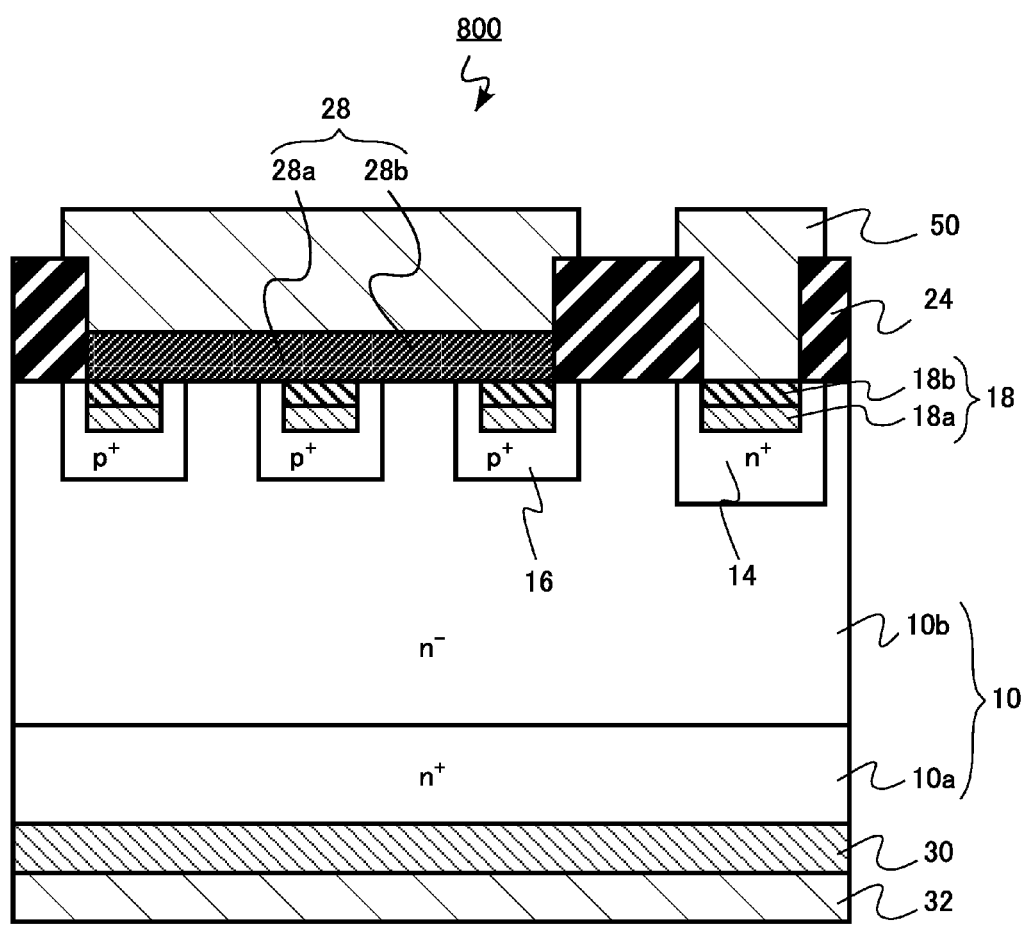
FIG. 17 is a cross sectional schematic diagram illustrating a semiconductor device according to an eighth embodiment.

FIG. 17 is a cross sectional schematic diagram illustrating a semiconductor device according to the present embodiment. The semiconductor device according to the present embodiment is an MPS diode.

As shown in FIG. 17, an MPS diode 800 uses a 4H—SiC substrate 10 including an n$^+$-type SiC layer 10a and an n$^-$-type SiC layer 10b of which n-type impurity concentration is less than that of the n$^+$-type SiC layer 10a.

In the n$^-$-type SiC layer 10b, a p$^+$-type SiC region 16 is formed. The p$^+$-type SiC region 16 functions as a PiN region for passing surge current. The n$^-$-type SiC layer 10b is formed with an n$^+$-type SiC region 14 with a insulating film 24 interposed therebetween and a diode region provided with a p$^+$-type SiC region 16. The n$^+$-type SiC region 14 functions as a channel stop layer, i.e., a termination structure of the MPS diode 800.

On the p$^+$-type SiC region 16 and on the n$^+$-type SiC region 14, first nickel silicide regions 18 are formed.

The first nickel silicide region 18 includes a first layer 18a and a second layer 18b having a carbon ratio (carbon concentration) lower than that of the first layer 18a. The second layer 18b is formed on the first layer 18a, i.e., the second layer 18b is formed at a side away from the p$^+$-type SiC region 16 with respect to the first layer 18a. The average grain diameter of the nickel silicide in the second layer 18b is more than the average grain diameter of the nickel silicide in the first layer 18a.

On the first nickel silicide region 18 of the p$^+$-type SiC region 16, a first metallic electrode 28 having a stacked structure including a titanium (Ti) layer 28a and an aluminum (Al) layer 28b is formed as an anode electrode.

On the first nickel silicide region of the n$^+$-type SiC region 14, a third metallic electrode 50 made of aluminum (Al) is formed.

The n$^+$-type SiC layer 10a functions as a cathode region of the MPS diode 800. On the n$^+$-type SiC layer 10a, a second nickel silicide region (nickel silicide film) 30 is formed. On the second nickel silicide region 30, a second metallic electrode 32 made of, e.g., aluminum (Al) is provided as a cathode electrode.

A termination structure for alleviating electric field such as resurf structure may be applied as necessary to the SiC surface of the SiC region device end portion in contact with the region formed with the insulating film 24 in FIG. 17 in accordance with the purpose of the device.

Hereinabove, according to the present embodiment, the carbon concentration on the surface of the metal silicide is reduced, so that the contact property between the metallic silicide film and the metallic electrode is improved, and film peel-off is less likely to occur. Therefore, the contact characteristics and the reliability of the MPS diode are improved. In addition, the resistance of the metallic silicide film is reduced, which improves the contact characteristics of the MPS diode.

In the MPS diode, the insulating film 24 such as oxide film is formed on the SiC in the junction termination region. When the interface between the oxide film and the SiC is made rough due to the high-temperature annealing for forming the metal silicide, the extension of the depletion layer is affected, which may cause problems such as drop of the withstand voltage, increase of the leakage current, and reduction of the reliability. According to the present embodiment, in the low-temperature thermal step, the metal silicide having excellent characteristics can be formed. Therefore, the MPS diode and the manufacturing method thereof can be achieved with high performance and high reliability.

While certain embodiments have been described, these embodiments have been presented by way of example only, and are not intended to limit the scope of the inventions. Indeed, the semiconductor device and the method for manufacturing the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a silicon carbide;
a metal silicide formed on the silicon carbide, the metal silicide including a first layer and a second layer having a carbon ratio lower than that of the first layer; and
a metallic electrode formed on the metal silicide,
wherein the second layer is formed on the first layer, and the second layer is in contact with the metallic electrode, and
an average grain diameter of a metal silicide in the second layer is larger than an average grain diameter of a metal silicide in the first layer.

2. The device according to claim 1, wherein a film thickness of the metal silicide is equal to or less than 100 nm.

3. The device according to claim 1, wherein a carbon ratio in the second layer is less than 20. atomic %, and
a carbon ratio in the first layer is equal to or more than 20 atomic %.

4. The device according to claim 1, wherein the metal silicide is a nickel silicide.

\* \* \* \* \*